(12) United States Patent
Venkatraman

(10) Patent No.: US 8,048,740 B2
(45) Date of Patent: Nov. 1, 2011

(54) VERTICAL MOS TRANSISTOR AND METHOD THEREFOR

(75) Inventor: Prasad Venkatraman, Gilbert, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 12/630,621

(22) Filed: Dec. 3, 2009

(65) Prior Publication Data

US 2010/0078717 A1   Apr. 1, 2010

Related U.S. Application Data

(62) Division of application No. 11/777,893, filed on Jul. 13, 2007, now Pat. No. 7,652,329.

(51) Int. Cl.
*H01L 21/00* (2006.01)
(52) U.S. Cl. .......... 438/268; 257/60; 257/135; 257/263; 257/330

(58) Field of Classification Search .................. 438/268; 257/60, 135, 263, 330
See application file for complete search history.

(56) References Cited

U.S. PATENT DOCUMENTS

| 4,786,960 | A * | 11/1988 | Jeuch ............................ 257/374 |
| 5,422,844 | A * | 6/1995 | Wolstenholme et al. 365/185.18 |
| 5,512,504 | A * | 4/1996 | Wolstenholme et al. ..... 438/130 |
| 5,614,744 | A * | 3/1997 | Merrill ......................... 257/291 |
| 5,614,751 | A * | 3/1997 | Yilmaz et al. ................. 257/394 |
| 7,087,958 | B2 * | 8/2006 | Chuang et al. ................. 257/335 |
| 7,453,119 | B2 | 11/2008 | Bhalla et al. ................... 257/330 |
| 7,683,453 | B2 * | 3/2010 | Williams et al. .............. 257/490 |
| 2005/0205897 | A1 | 9/2005 | Depetro et al. ................ 257/213 |
| 2007/0090470 | A1 | 4/2007 | Heringa ........................ 257/409 |

* cited by examiner

*Primary Examiner* — Jarrett Stark
*Assistant Examiner* — Nicholas Tobergte
(74) *Attorney, Agent, or Firm* — Robert F. Hightower

(57) ABSTRACT

In one embodiment, a vertical MOS transistor is formed without a thick field oxide and particularly without a thick field oxide in the termination region of the transistor.

9 Claims, 3 Drawing Sheets

US 8,048,740 B2

VERTICAL MOS TRANSISTOR AND METHOD THEREFOR

The present application is a divisional application of prior U.S. application Ser. No. 11/777,893, filed on Jul. 13, 2007 now U.S. Pat. No. 7,652,329, which is hereby incorporated by reference, and priority thereto for common subject matter is hereby claimed.

BACKGROUND OF THE INVENTION

The present invention relates, in general, to electronics, and more particularly, to methods of forming semiconductor devices and structures.

In the past, the semiconductor industry formed vertical MOS transistors with various device structures using various semiconductor processing methods. The prior vertical MOS transistors generally had a field oxide region that was positioned to overlie a portion of a field termination region of the vertical MOS transistor. These field oxide regions were formed by thermal oxidation. The field oxide regions were used to reduce electric fields in the termination region and to assist in providing a high breakdown voltage for the vertical MOS transistor. However, forming these thermally grown field oxide regions typically required at least one or more masks and related processing steps which increased the cost of the vertical MOS transistor.

Accordingly, it is desirable to have a vertical MOS transistor that has fewer processing steps and that has a lower cost.

For simplicity and clarity of the illustration, elements in the figures are not necessarily to scale, and the same reference numbers in different figures denote the same elements. Additionally, descriptions and details of well-known steps and elements are omitted for simplicity of the description. Although the devices are explained herein as certain N-channel or P-Channel devices, a person of ordinary skill in the art will appreciate that complementary devices are also possible in accordance with the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

In addition, the device of the present invention will be illustrated to show either a cellular design (where the body regions are a plurality of cellular regions) or a single body design (where the body region is comprised of a single region formed in an elongated pattern, typically in a serpentine or a stripe pattern). However, the device of the present invention will be described as a single base design throughout the description for ease of understanding. It should be understood that it is intended that the present invention encompass both a cellular design and a single base design.

DETAILED DESCRIPTION OF THE DRAWINGS

Figure 1:
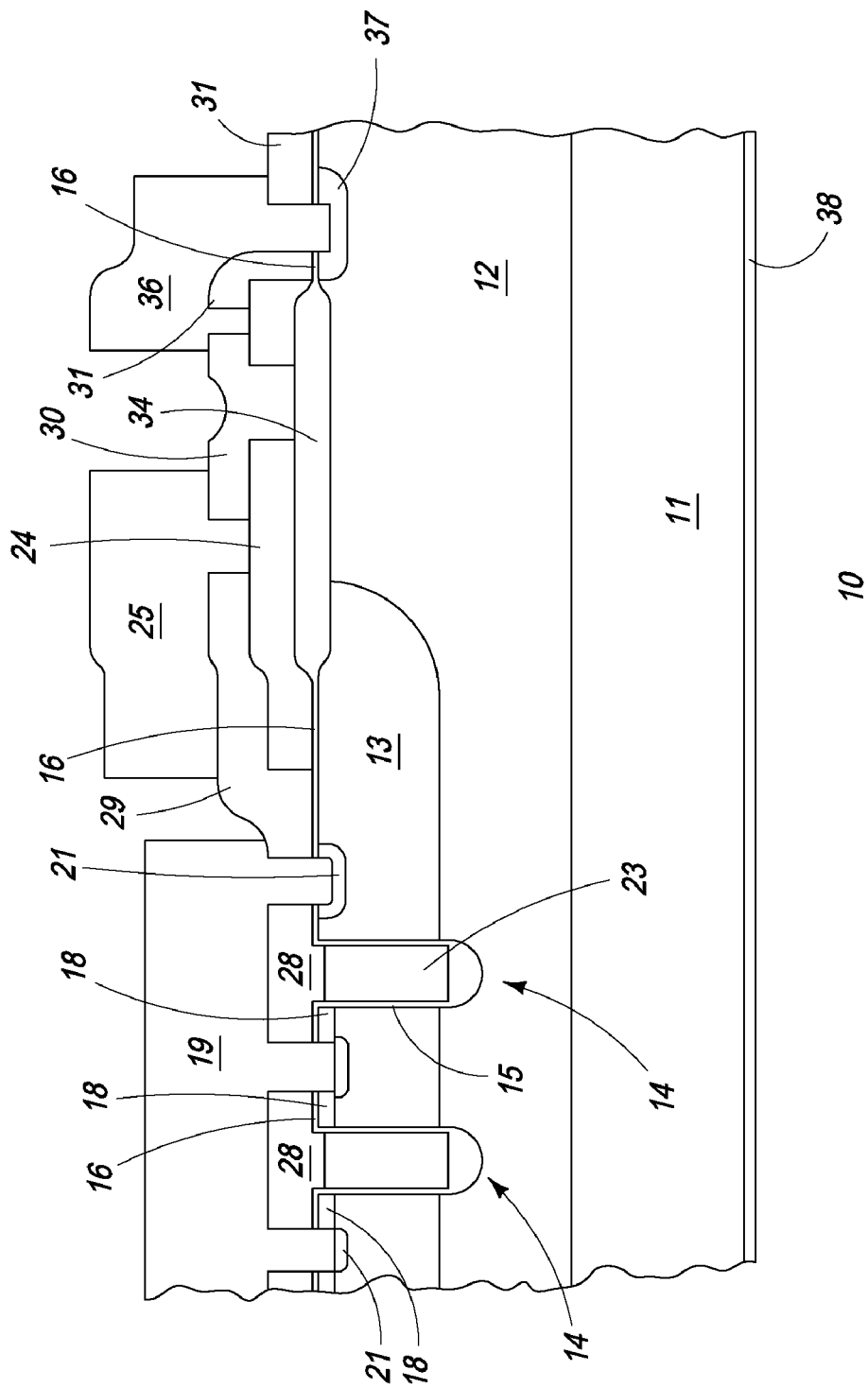
FIG. 1 illustrates an enlarged cross-sectional portion of a prior art vertical MOS transistor.

FIG. 1 illustrates an enlarged cross-sectional portion of a prior art vertical MOS transistor 10 that includes a thermally grown field oxide (FOX) 34. Prior art vertical MOS transistor 10 is formed on an N-type semiconductor substrate which has an N-type epitaxial layer 12 on one surface and a drain electrode 38, such as a metal conductor, formed on a second surface. A P-type region 13 is formed within layer 12 to facilitate forming source regions and gate structures for transistor 10. Source regions 18 are positioned adjacent to trench gate structures 14. Heavily doped P-type regions 21 are formed within regions 13, and are positioned between source regions 18, to facilitate forming ohmic contacts to P-type regions 13. Trench gate structures 14 have a sidewall gate insulator 15 and a gate conductor material 23 within a trench that is formed in layer 12. A thin insulator 16 may be formed on a portion of the surface of layer 12. A field oxide (FOX) 34 generally is formed by a thermal oxidation procedure that oxidizes portions of the surface of layer 12. Such processes generally are referred to as LOCOS processes. A portion of FOX 34 is formed to overlie P-type region 13. In order to form FOX 34, it is necessary to mask and protect portions of layer 12 that are not to be oxidized, thus, separate masking and processing steps are required to form FOX 34. Another gate conductor material 24 is applied on a portion of FOX 34 so that material 24 overlies a portion of insulator 16 and also extends over to overlie a portion of FOX 34. An inter-layer dielectric material generally is applied to the surface and patterned to form dielectric regions 28, 29, 30, and 31. A source conductor material 19, such as a metal conductor, generally is applied to form electrical contact with source regions 18 and also to body regions 21. Another gate conductor material 25, such as a metal conductor, generally is applied to form electrical contact to gate conductor material 24. Gate conductor material 24 typically contacts gate conductor material 23 at the ends of the trench (not shown). Often gate conductor materials 23 and 24 are the same material, and are formed at the same time. Another conductor material 36 is applied to form electrical contact to layer 12 through a doped region 37. Material 36 and region 37 generally form a ring that surrounds the outside of transistor 10. FOX 34 overlies region 13 and extends past the junction formed between regions 12 and 13. Additionally, gate conductor material 24 must be on FOX 34 and extend beyond the edge of the junction.

Figure 2:
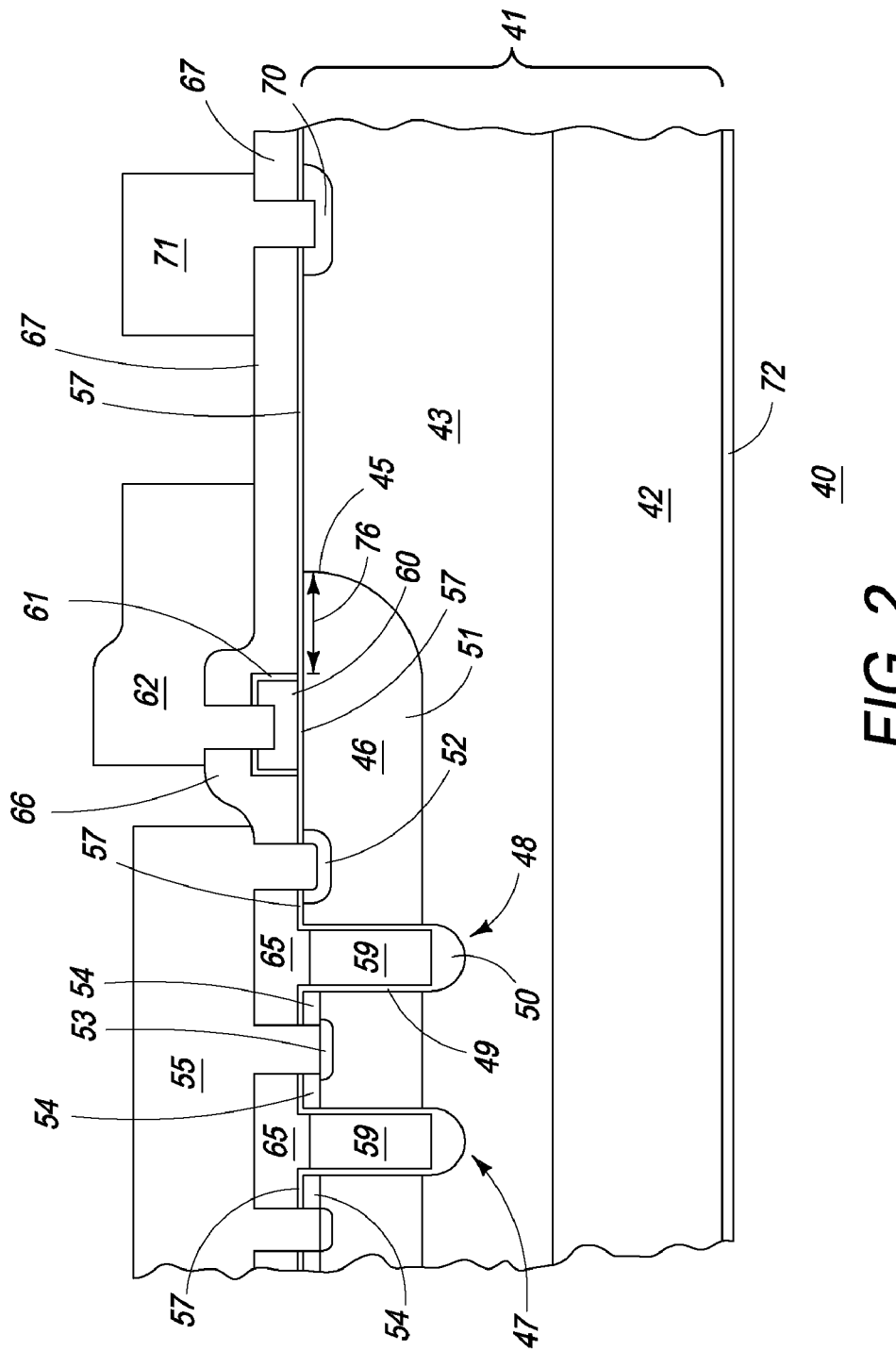
FIG. 2 illustrates an enlarged cross-sectional portion of a vertical MOS transistor according to the present invention.

FIG. 2 schematically illustrates an enlarged cross-sectional portion of an embodiment of a vertical MOS transistor 40 that is formed without a thermally grown field oxide. Transistor 40 is formed on a semiconductor substrate 41 that includes a bulk semiconductor substrate 42 on which an epitaxial layer 43 is formed. In some cases, epitaxial layer 43 may be omitted. Bulk semiconductor substrate 42 and epitaxial layer 43 generally are formed to have an N-type conductivity. A first doped region 46 is formed on the surface of substrate 41 and extends into substrate 41. Region 46 has an outside edge 45 that extends from the surface of substrate 41 in a vertical manner toward a horizontal bottom edge 51 of region 46. Region 46 generally is formed with a P-type conductivity and generally has a peak doping concentration that is greater than the doping concentration of layer 43. Preferably, the doping concentration of region 46 is at least one order of magnitude greater than the doping concentration of layer 43. Trench type gates 47 and 48 usually are formed by forming openings extending into substrate 41 including extending into layer 43. A gate insulator 49 is formed on the side-walls and on the bottom of the opening and a gate conductor material 59 is formed within the opening. Gate conductor material 59 generally is doped polysilicon but may also include a metal or a metal silicide. The bottom of the opening often has a thick insulator 50 that has a thickness that is greater than the thickness of gate insulator 49. Source regions 54 generally are formed extending from the surface of substrate 41 into region 46. Source regions 54 generally are a least adjacent to trench type gates 47 and 48 and preferably are adjoining gates 47 and 48 by abutting gate insulator 49. Body contacts are formed as doped regions 52 and 53 within region 46. The body contacts of regions 52 and 53 facilitate forming electrical connection between source regions 54 and region 46 in order to reduce the tendency to form parasitic bipolar transistors that could damage transistor 40. A doped region 70 is formed to facilitate making electrical connection to substrate 41 through epitaxial layer 43. A thin insulator 57 generally is formed across the surface of substrate 41 and patterned to form openings through insulator 57 to facilitate forming gates 47 and 48 and to facilitate forming electrical connections. Insulator 57 may be formed at the same time, and approximately the same thickness, that gate insulator 49 is formed or may be formed at a different time and a different thickness. The thickness of insulator 57 generally is about two hundred to one thousand (200-1000) Angstroms and usually depends on the desired gate voltage of transistor 40. For example, for gate voltages of about twenty volts (20V) and forty volts (40V), the respective thicknesses are about five hundred (500) and one thousand (1000) Angstroms.

The portion of transistor 40 that extends from region 52 to edge 45 is generally referred to as the edge termination region. In order to keep the breakdown voltage high, it is important to reduce the intensity of electric fields that are formed in this edge termination region. Thus, gate conductor material 60 is formed on a portion of insulator 57 that overlies a portion of region 46 and is positioned between gate 48 and outside edge 45. Gate conductor material 60 is not formed on a thermally grown field oxide region. In the preferred embodiment, material 60 is formed on insulator 57. Gate conductor material 60 generally is position a distance 76 from outside edge 45 in order to ensure that material 60 does not overlie a P-N junction that is formed along edge 45 at the interface between region 46 and substrate 41. Distance 76 generally is measured from the point where edge 45 intersects with the surface of substrate 41. When transistor 40 is reversed biased, a depletion region will be formed along edge 45 at the interface between region 46 and substrate 41. It is preferable to ensure that material 60 does not overlie the portion of region 46 where the depletion region will be formed in order to facilitate forming a high breakdown voltage. Additionally, it is preferable that the portion of material 60 that physically contacts conductor 62 overlie region 46 and be spaced away from edge 45. An optional thin dielectric 61 may be formed on the sidewalls and top of material 60.

An inter-layer dielectric material usually is applied to the surface and patterned to form dielectric layer regions 65, 66, and 67. Dielectric layer region 65 overlies gate conductor material 59 to insulate material 59. Dielectric layer region 66 is formed on insulator 57 and extends to overlie an edge of material 60 that is proximate to gate 48. Dielectric layer region 67 overlies an opposite edge of material 60, extends across insulator 57 to overlie edge 45, and usually continues to extend across insulator 57 away from edge 45. Region 67 generally is about two thousand to four thousand Angstroms (2000-4000×10$^{-8}$ cm) thick. A conductor material is applied and then patterned to form a source conductor 55 that makes electrical connection to source regions 54 and to body regions 52 and 53. Region 65 insulates conductor 55 from gate material 59. Another portion of the conductor material is patterned to form another gate conductor 62 that makes electrical connection to gate material 60. In order to assist in reducing the electric fields, gate conductor material 62 is formed on a portion of insulator 67 that overlies a portion of layer 43, and region 46 and is positioned to extend beyond outside edge 45. Another portion of the conductor material is patterned to form a conductor 71 that makes an electrical connection to substrate 41. Conductor 71 and doped region 70 form a continuous ring around the outside edges of transistor 40 in order to terminate electric fields at the outside edges of transistor 40.

Forming transistor 40 to be devoid of a thermally grown field oxide region overlying the interface of region 46 and substrate 41, and particularly the interface along edge 45, reduces the number of processing steps required to form transistor 40. Thermal oxidation steps require a lot of processing time and also require masking steps that increase the cost. Forming conductor 62 to overlie the interface along edge 45 assists in reducing the electric field in the termination region of transistor 40 thereby keeping the breakdown voltage high. Typically, the breakdown voltage of transistor 40 is at least equal to the breakdown voltage of transistor 10.

Figure 3:
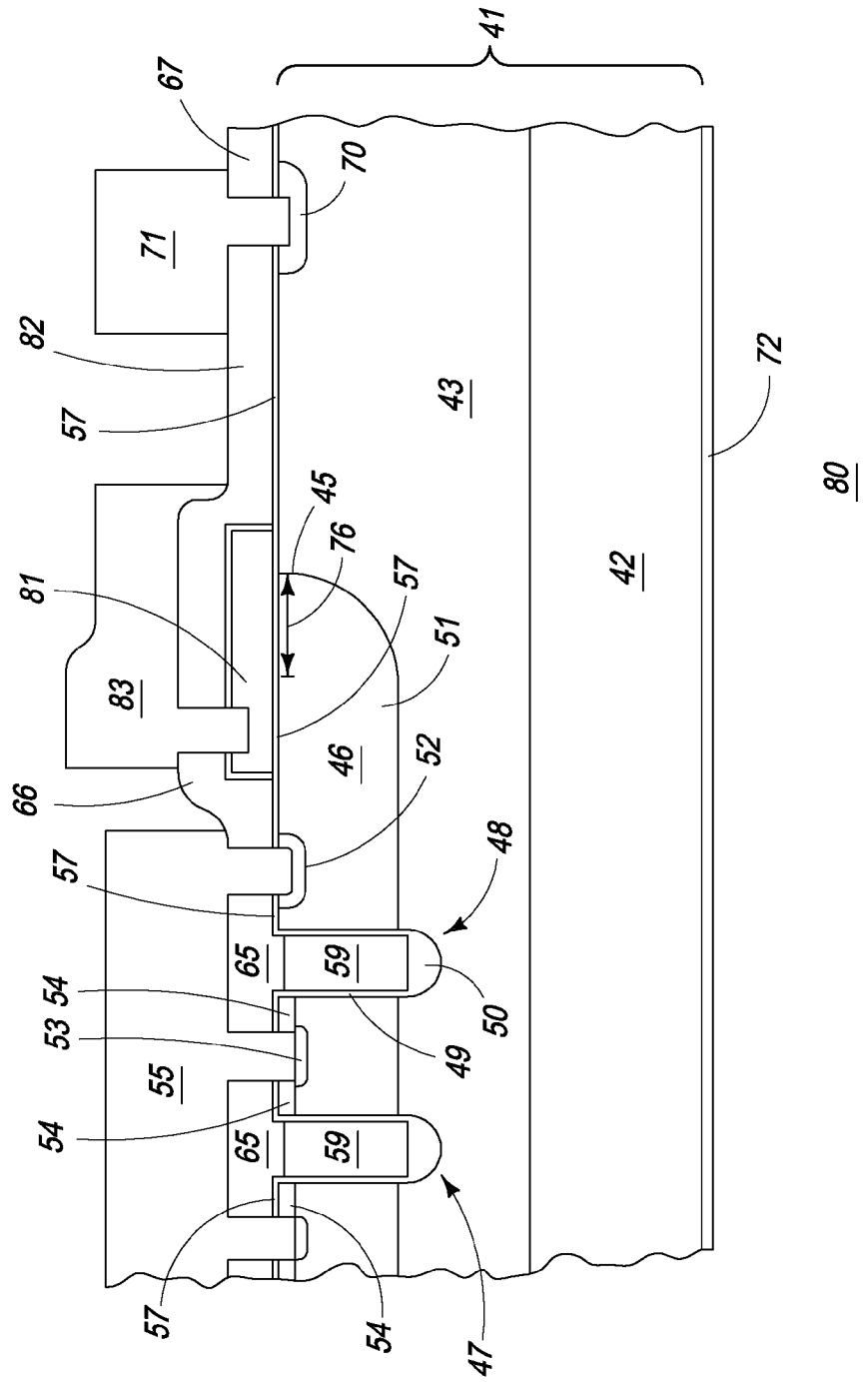
FIG. 3 illustrates an enlarged cross-sectional portion of another vertical MOS transistor that is an alternate embodiment of the vertical MOS transistor of FIG. 2 according to the present invention.

FIG. 3 schematically illustrates an enlarged cross-sectional portion of an embodiment of a vertical MOS transistor 80 that is also formed without a thermally grown field oxide. Transistor 80 is an alternate embodiment of transistor 40 except that a gate conductor material 81 is used instead of gate conductor material 60 of FIG. 2. Gate material 81 is formed on thin insulator 57 but material 81 extends across insulator 57 to overlie edge 45 and an adjacent portion of substrate 41. In this embodiment, the thickness of insulator 57 generally is about two hundred to one thousand (200-1000) Angstroms and usually depends on the desired breakdown voltage of transistor 80. For example, for breakdown voltages of thirty volts (30V) and forty volts (40V), the respective thicknesses are about seven hundred (700) and one thousand (1000) Angstroms. A dielectric region 82 is used instead of region 67 due to the different shape of material 81. Similarly, another gate conductor 83 is used instead of conductor 62 because of the different shape of material 81.

In view of all of the above, it is evident that a novel device and method is disclosed. Forming the vertical MOS transistor without forming a thermal field oxide region reduces the costs. Forming gate material 60 to overlie region 46 keeps the breakdown voltage high. Also, forming insulator 67 overlying substrate 41 that is external to region 43 and forming gate material 62 overlying insulator 67 assists in increasing the breakdown voltage. This eliminates the need for forming a separate FOX and reduces the costs of the resulting semiconductor device. Further, forming gate material 62 overlying edge 45 assists in increasing the breakdown voltage high.

While the subject matter of the invention is described with specific preferred embodiments, it is evident that many alternatives and variations will be apparent to those skilled in the semiconductor arts. For example, gate materials 59, 60 and 81 may include a metal or a silicide. Also, insulators 67 and 82 may be a single layer, or may be a stack comprised of different materials such as oxide and nitride.

The invention claimed is:

1. A method of forming a vertical MOS transistor comprising:

providing a semiconductor substrate of a first conductivity type having a first surface and a second surface;

forming a first doped region of a second conductivity type on the first surface of the semiconductor substrate and extending into the semiconductor substrate;

forming a drain conductor on the second surface of the semiconductor substrate;

forming source regions and gate regions of the vertical MOS transistor extending into the first doped region wherein the vertical MOS transistor is devoid of a field oxide region overlying an interface between the semiconductor substrate and an outside edge of the first doped region wherein a portion of the interface extends toward the first surface of the semiconductor substrate;

forming a thin dielectric overlying the portion of the interface of the semiconductor substrate and the outside edge of the first doped region;

forming an inner-layer dielectric overlying the thin dielectric and overlying at least the portion of the interface; and forming a gate conductor on a first portion of the thin insulator and positioned between the outside edge of the first doped region and the gate regions.

2. A method of forming a vertical MOS transistor comprising:

providing a semiconductor substrate of a first conductivity type having a first surface and a second surface;

forming a first doped region of a second conductivity type on the first surface of the semiconductor substrate and extending into the semiconductor substrate;

forming a drain conductor on the second surface of the semiconductor substrate; and forming source regions and gate regions of the vertical MOS transistor extending into the first doped region wherein the vertical MOS transistor is devoid of a thermally grown field oxide region overlying a portion of an interface between the semiconductor substrate and an outside edge of the first doped region wherein the portion of the interface extends toward the first surface of the semiconductor substrate.

3. The method of claim 1 wherein forming source regions and gate regions of the vertical MOS transistor includes forming the gate regions as trench type gates extending from the first surface of the semiconductor substrate into the first doped region and forming a source region adjacent to a trench type gate.

4. The method of claim 1 wherein forming source regions and gate regions of the vertical MOS transistor includes forming the thin insulator on the first surface of the semiconductor substrate and overlying the interface between the semiconductor substrate and the outside edge of the first doped region.

5. The method of claim 4 further including forming the gate conductor to not extend to overlie the interface between the semiconductor substrate and the outside edge of the first doped region.

6. The method of claim 4 further including forming the inner-layer dielectric on the first portion of the thin insulator and to overlie a portion of the gate conductor.

7. A method of forming a vertical MOS transistor comprising:

providing a semiconductor substrate of a first conductivity type having a first surface and a second surface;

forming a first doped region of a second conductivity type on the first surface of the semiconductor substrate and extending into the semiconductor substrate including forming an interface between the semiconductor substrate and the first doped region with a portion of the interface extending toward the first surface of the semiconductor substrate;

forming a drain conductor on the second surface of the semiconductor substrate; and forming source regions and gate regions of the vertical MOS transistor extending into the first doped region wherein the vertical MOS transistor is devoid of a field oxide region overlying the portion of the interface between the semiconductor substrate and the outside edge of the first doped region.

8. The method of claim 1 wherein forming the gate conductor includes forming the gate conductor material overlying the portion of the interface that extends toward the first surface.

9. The method of claim 1 further including forming a source conductor forming an electrical connection to the source regions but not forming an electrical connection to the gate conductor.

\* \* \* \* \*